(12) United States Patent
Sonetaka et al.

(10) Patent No.: US 6,838,709 B2
(45) Date of Patent: Jan. 4, 2005

(54) BIPOLAR TRANSISTOR

(75) Inventors: Shinichi Sonetaka, Ibaraki (JP);
Yasuyuki Toyoda, Mukou (JP);
Kazuhiro Arai, Imaichi (JP); Yorito Ota, Kobe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/681,146

(22) Filed: Oct. 9, 2003

(65) Prior Publication Data

US 2004/0075108 A1 Apr. 22, 2004

(30) Foreign Application Priority Data

Oct. 11, 2002 (JP) ........................................ 2002-298761

(51) Int. Cl.[7] ................. H01L 31/0328; H01L 31/0336; H01L 31/072; H01L 31/109

(52) U.S. Cl. ........................ 257/197; 257/205; 257/273; 257/477; 257/517; 257/526; 257/552

(58) Field of Search .......................... 257/47, 197, 205, 257/273, 477, 517, 526, 552

(56) References Cited

FOREIGN PATENT DOCUMENTS

JP 9-237882 9/1997

*Primary Examiner*—Thien F Tran
(74) *Attorney, Agent, or Firm*—Wenderoth, Lind & Ponack, L.L.P.

(57) ABSTRACT

A bipolar transistor includes the first group of transistors 610*a*, the second group of transistors 610*b*, the third group of transistors 610*c* and the fourth group of transistors 610*d*. The groups of transistors have unit transistors with emitters, bases and collectors that are connected electrically in parallel and the number of unit transistors is different from group to group and 2, 4, 8, and 16, respectively.

15 Claims, 8 Drawing Sheets ns/<br>
BIPOLAR TRANSISTOR

BACKGROUND OF THE INVENTION (1) Field of the Invention

The present invention relates to a bipolar transistor, and particularly to a high-frequency silicon bipolar transistor.

(2) Description of the Related Art

In recent years, the mobile communication market is increasing with sophisticated, miniaturized and short-life devices. Further, cost effective transistors with flexible sizes are expected within a short period of time. As a means to meet these requirements, transistors of flexible transistor sizes are realized by setting up plural groups of transistors of required transistor sizes on one semiconductor substrate and connecting selected groups of transistors by lead wires. (For example, refer to Japanese Laid-Open Patent application No. 09-237882 (pp. 2–3, FIG. 7, FIG. 8).)

Hereinafter, a conventional bipolar transistor with a structure described above is explained using figures.

FIGS. 1A and 1B are plan views of the top surface of the conventional bipolar transistor. FIG. 1A is a plan view when one group of transistors is selected; FIG. 1B is a plan view when two groups of transistors are selected.

As is shown in FIGS. 1A and 1B, the conventional bipolar transistor is a comb-shaped and multi-fingered bipolar transistor in which unit transistors that compose a group or groups of transistors are connected in parallel. The conventional bipolar transistor is composed by connecting an emitter or emitters of a first group of transistors 110a and/or a second group of transistors 110b and/or a third group of transistors 110c with an emitter pad 140 for wire bonding by an emitter lead wire 120 and connecting a base or bases of the first group of transistors 110a and/or the second group of transistors 110b and/or the third group of transistors 110c with a base pad 150 for wire bonding by a base lead wire 130. The first group of transistors 110a, the second group of transistors 110b and the third group of transistors 110c are formed on a predetermined area of a semiconductor substrate 100. Here, although it is not shown in FIGS. 1A and 1B, a collector electrode is pulled out from the reverse side of the semiconductor substrate 100.

Here, the first group of transistors 110a, the second group of transistors 110b and the third group of transistors 110c are transistors in which a plurality of unit transistors with emitters, bases and collectors is connected electrically in parallel. Each group of transistors has a different number of unit transistors and the size of each group of transistors is different.

FIG. 2 is a cross-sectional view of the bipolar transistor (a cross-sectional view across the b–b' line in FIG. 1A). Note that the same elements in FIG. 1A are given the same characters and their detailed explanations are omitted here.

As is shown in FIG. 2, a plurality of unit transistors is formed in the first group of transistors 110a and the second group of transistors 110b. The plurality of unit transistors is composed of N type collectors 210 that are formed on an $N^+$ type semiconductor substrate 200 and that are made from silicon epitaxial layers, the P type bases 220 that are formed on the surface of the N type collectors 210 by an ion implantation technique, a silicon epitaxial method and the like, element separation regions 230 that are formed in the N type collectors 210 in order to insulate and separate each P type base 220, and N type emitters 240 that are formed on surfaces of the P type bases 220 by diffusing an impurity. In order to separate the first group of transistors 110a and the second group of transistors 110b completely like islands, an insulation separation region 250 that is formed by a trench separation method, a LOCOS (Local Oxidation of Silicon) method and the like, and the depth of which reaches the $N^+$ type semiconductor substrate 200, is formed as a channel stopper between the first group of transistors 110a and the second group of transistors 110b. The plurality of unit transistors is covered by an insulation film 260.

Additionally, N type polycrystalline silicon films 270 are formed on the N type emitters 240; the P type polycrystalline silicon films 280, as an outside base layer, are formed on the P type bases 220 and the element separation regions 230.

Here, through holes 290 that penetrate the insulation film 260 are formed in the insulation film 260. The emitter lead wire 120 and the base lead wires 130 are connected with the N type polycrystalline silicon films 270 and the P type polycrystalline silicon films 280 respectively via the through holes 290 in which wiring plugs are embedded.

Regarding the bipolar transistor with the structure described above, bipolar transistors of different transistor sizes are, as is shown in FIGS. 1A and 1B, realized by selecting an arbitrary group or arbitrary groups of transistors among the first group of transistors 110a, the second group of transistors 110b and the third group of transistors 110c and connecting the emitter lead wire 120 and the base lead wire 130 with the selected group(s) of transistors. Here, a manufacturing method for the bipolar transistor with the structure described above is realized within the range of ordinary micro fabrication technology and self-aligning technology.

As is described above, since the conventional bipolar transistor can realize bipolar transistors of different transistor sizes only with selection and connection by wiring, it is possible to realize a bipolar transistor that has excellent manufacturing efficiency and enables itself to be provided to the market in a brief period of time.

However, since it is little better than a plurality of transistor groups of required transistor sizes is aligned on one semiconductor substrate in the conventional bipolar transistor, there is a problem that the number of transistor sizes to be realized is limited and therefore it is impossible to meet further requirement of the market for flexible transistor sizes.

Then, as is shown in FIG. 3, a plan view and FIG. 4, a cross-sectional view (a cross-sectional view across the c–c' line in FIG. 3, the plan view) a bipolar transistor having one or plural number of unit transistors, the number being any one of integers ranging from 1 to 30, can be realized by forming a plurality of the N type emitters 240, for example thirty of them, in one group of transistors surrounded by the insulation separation regions 250, selecting the arbitrary emitter(s) and base(s) among the emitters and the bases formed in the group of transistors, and connecting the emitter lead wire(s) and the base lead wire(s) with the selected emitter(s) and base(s). Therefore, as a method for realizing a bipolar transistor that meets the above-mentioned requirement, a method for selecting and connecting the emitter(s) and the base(s) in one group of transistors is expected. By a method like this, however, whole conjunction capacitance of the base(s) and the collector(s) immediately below the unused emitter(s) is added as parasitic capacitance and capacitance between the collector(s) and the base(s) increases. Therefore, a problem that high-frequency characteristics deteriorate occurs and it is impossible to realize a bipolar transistor that meets the above-mentioned requirement by this method.

Moreover, as is shown in FIG. 5, a cross-sectional view, a bipolar transistor having one or plural number of unit transistors, the number being any one of integers ranging from 1 to 30, can be realized by forming a group of transistors whose number of emitters is one in a region surrounded by the insulation separation regions 250 on the same semiconductor substrate and setting up the plural groups of transistors, for example thirty of them. Therefore, as a method for realizing a bipolar transistor that meets the above-mentioned requirement, a method for setting up the plural groups of transistors whose number of emitters is one is also expected. By a method like this, however, a base and a collector are independently formed for each emitter. Consequently, the problem that high-frequency characteristics deteriorate does not occur because the parasitic capacity does not become large but another problem occurs, the problem being that an extremely large semiconductor substrate is necessary because the insulation separation regions 250 exist among each group of transistors. For that reason, it is impossible to realize a bipolar transistor that meets the above-mentioned requirement by this method, either.

SUMMARY OF THE INVENTION

In view of the foregoing, it is the object of the present invention to provide a bipolar transistor that can meet requirement of the market for flexible transistor sizes.

To achieve the above-mentioned object, the bipolar transistor according to the present invention is (claim 1).

Hereby, since the number of unit transistors for each group of transistors is $2^n$ (2, 4, 8, 16, . . . ), it is possible to realize the bipolar transistor having $2^n$ (i.e. all the even numbers to be realized) pieces of transistors, in other words, the bipolar transistor having various transistor sizes by selecting and connecting a plurality of groups of transistors. Therefore, an effect to realize the bipolar transistor that can meet requirement of the market for flexible transistor sizes is achieved.

Additionally, it is acceptable that (claim 2). Here, the m may be 4.

Hereby, since the bipolar transistor includes a group of transistors that has every even number of unit transistors, the number being 2 at the minimum and $2^m$ at the maximum, an effect to realize the bipolar transistor that has successive number of unit transistors is achieved.

Moreover, it is satisfactory that (claim 4). Here, (claim 5). Furthermore, it is acceptable that (claim 6).

Hereby, since the connection among the selected groups of transistors is performed by the lead wires, an effect of realizing the bipolar transistor that enables transistor sizes to be changed easily is achieved.

Additionally, it is satisfactory that (claim 7).

Hereby, an effect of realizing the bipolar transistor that has all the transistor sizes is achieved.

As further information about technical background to this application, Japanese patent application No. 2002-298761 filed on Oct. 10, 2002 is incorporated herein by reference.

BRIEF DESCRIPTION OF THE DRAWINGS

These and other subjects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

The bipolar transistor according to the embodiment of the present invention will be explained below with reference to the figures.

Figure 1A:
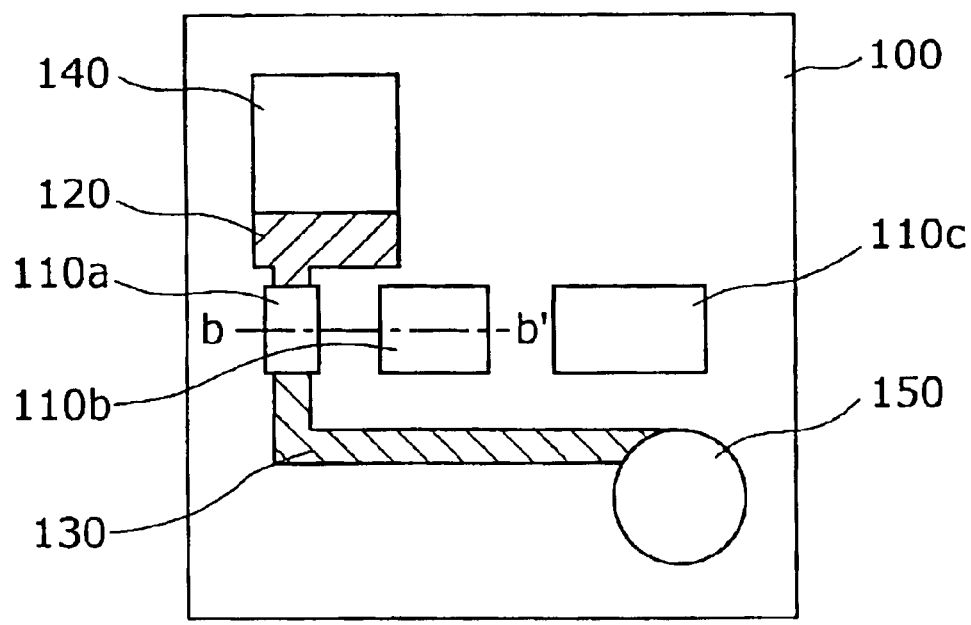
FIG. 1A is a plan view of the top surface of the conventional bipolar transistor when one group of transistors is selected.
Figure 1B:
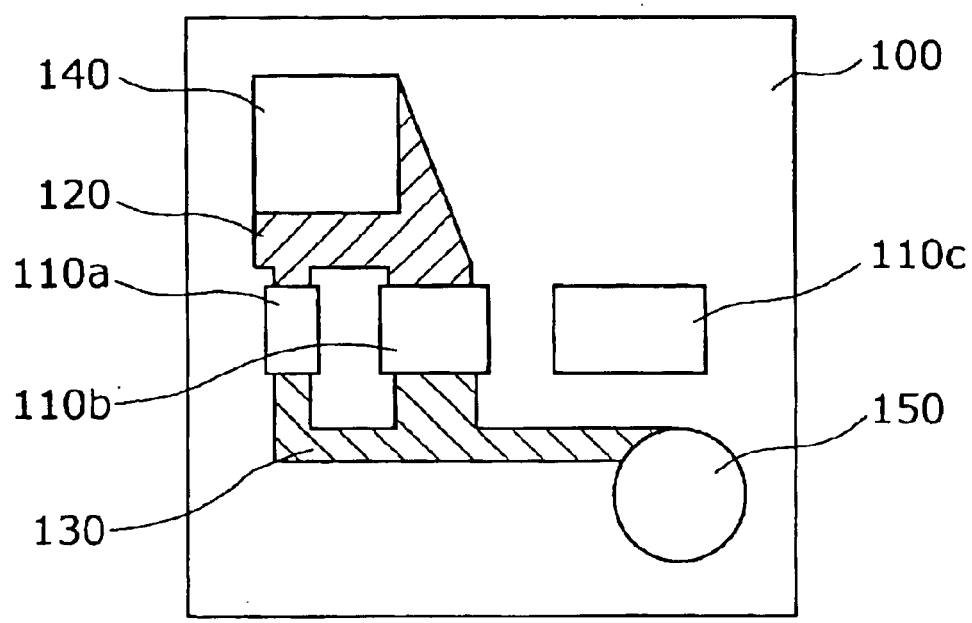
FIG. 1B is a plan view of the top surface of the conventional bipolar transistor when two groups of transistors are selected.
Figure 2:
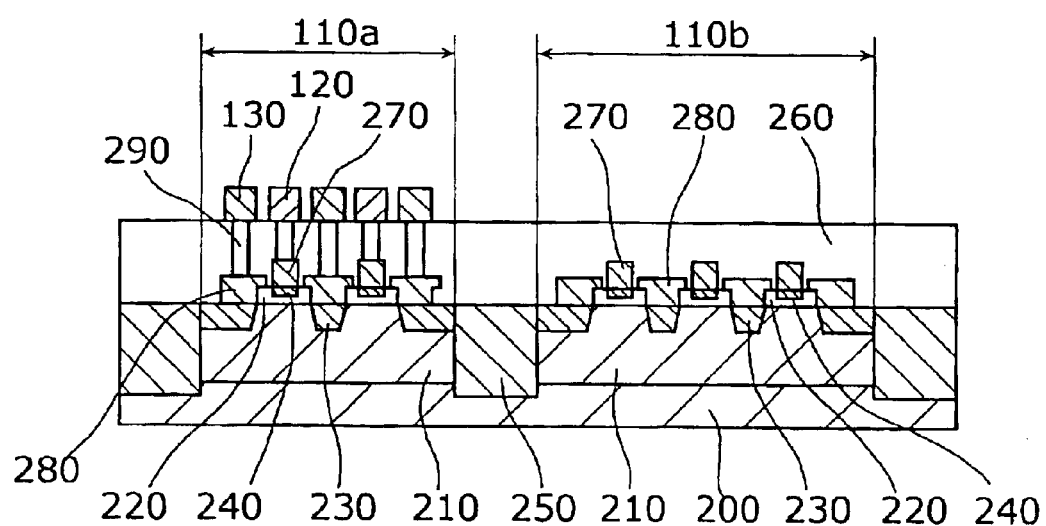
FIG. 2 is a cross-sectional view of the conventional bipolar transistor (a cross-sectional view across the b–b' line in FIG. 1A).
Figure 3:
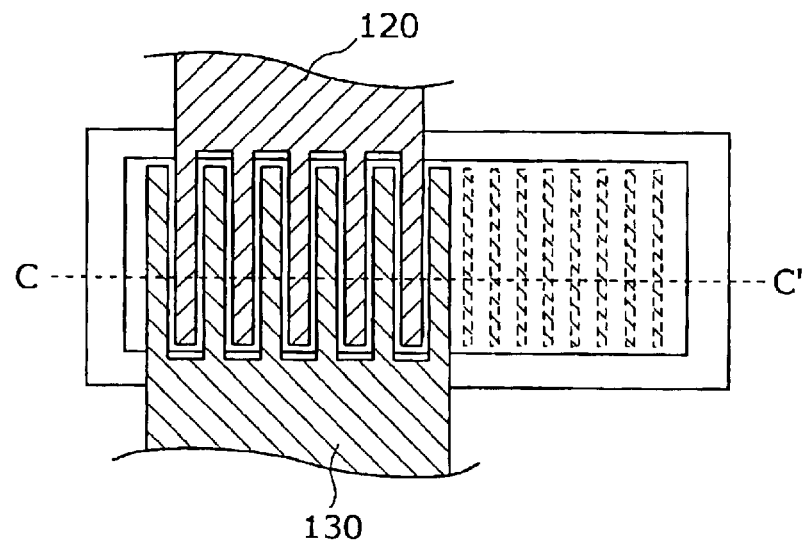
FIG. 3 is a plan view of the top surface of a modified example of the conventional bipolar transistor.
Figure 4:
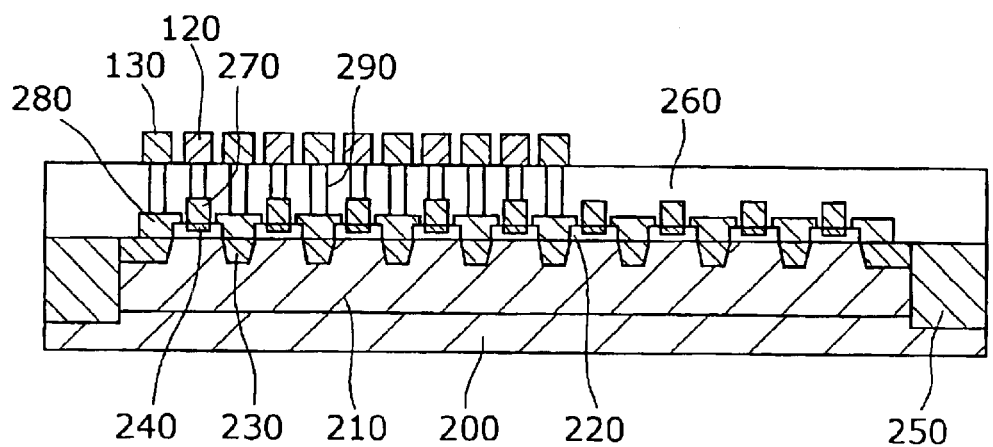
FIG. 4 is a cross-sectional view of a modified example of the conventional bipolar transistor (a cross-sectional view across the c–c' line in FIG. 3).
Figure 5:
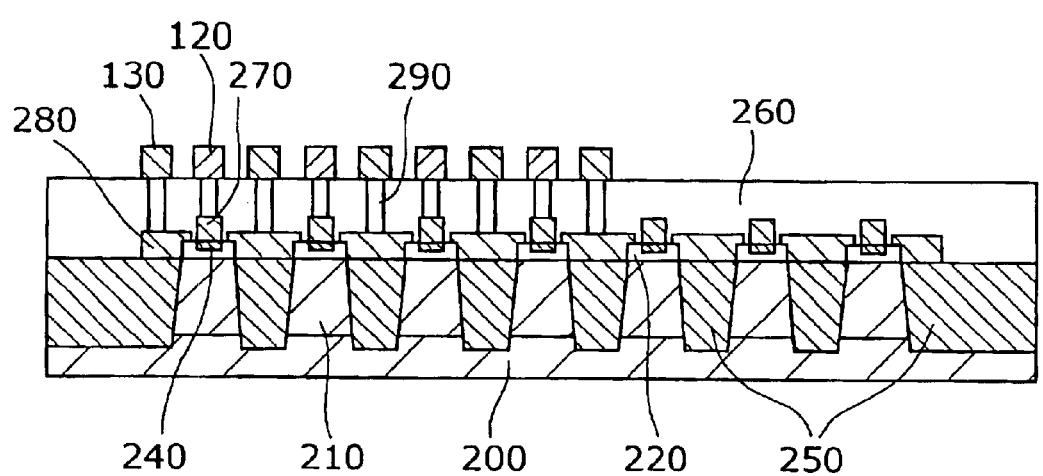
FIG. 5 is a cross-sectional view of another modified example of the conventional bipolar transistor.
Figure 6:
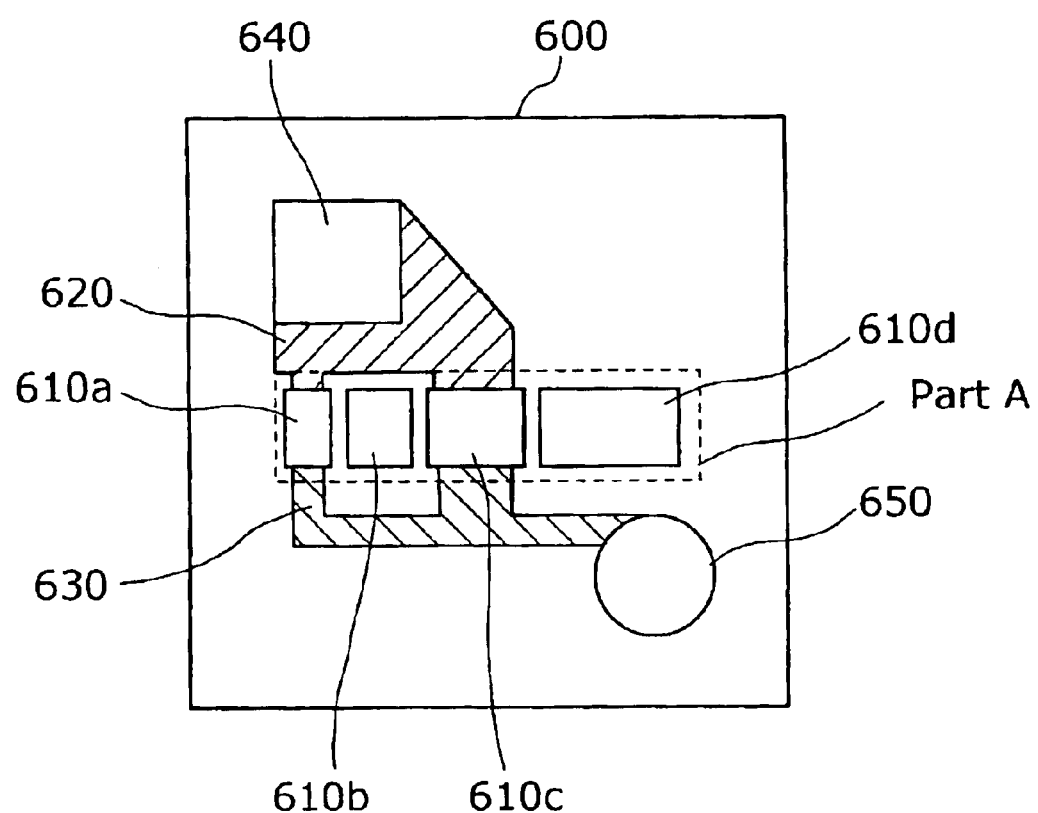
FIG. 6 is a plan view of the top surface of the bipolar transistor according to the embodiment of the present invention.
Figure 7:
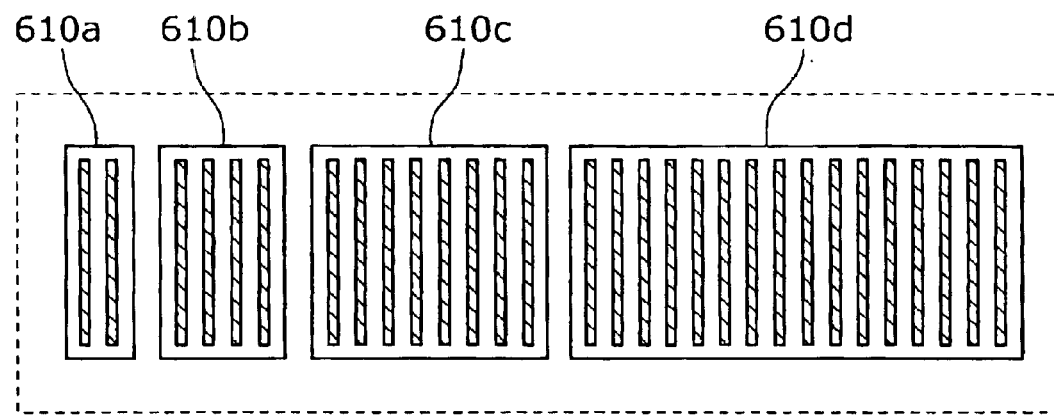
FIG. 7 is an enlarged plan view of the bipolar transistor according to the embodiment of the present invention (an enlarged view of the Part A in FIG. 6).

FIGS. 6–7 are plan views of the top surface of the bipolar transistor according to the embodiment of the present invention. FIG. 7 is an enlarged plan view of the Part A in FIG. 6.

As is shown in FIG. 6, the bipolar transistor according to the present embodiment is a comb-shaped and multi-fingered bipolar transistor that aims to realize a bipolar transistor which can meet requirement of the market for flexible transistor sizes and that is composed by connecting an emitter pad 640 for wire bonding via an emitter lead wire 620 with an emitter or emitters of a first group of transistors 610a and/or a second group of transistors 610b and/or a third group of transistors 610c and/or a fourth group of transistors 610d that are formed in a predetermined area on a semiconductor substrate 600 and connecting a base pad 650 for wire bonding via a base lead wire 630 with a base or bases of the first group of transistors 610a and/or the second group of transistors 610b and/or the third group of transistors 610c and/or the fourth group of transistors 610d.

Here, although it is not shown in FIG. 6, a collector electrode is pulled out from the reverse side of the semiconductor substrate 600. It is not, however, limited to this way.

Here, the first group of transistors 610a, the second group of transistors 610b, the third group 610c and the fourth group of transistors 610d are transistors in which a plurality of unit transistors having emitters, bases and collectors is connected electrically in parallel. The number of unit transistors of each group of transistors is different from each other, the number being $2^n$ (n is a positive integer) and 2 at the minimum and $2^m$ (m is the total number of the groups of transistors) at the maximum. By the way, when the bipolar transistor has groups of transistors that include 2, 4, 8 and 16 pieces of unit transistors, it is possible to pass a current of 100 mA at the maximum in a tip area that causes no problem. Therefore, in the present embodiment, as FIG. 7 shows, the number of unit transistors of the first group of transistors 610a, the second group of transistors 610b, the third group of transistors 610c and the fourth group of transistors are decided to be 2, 4, 8 and 16, respectively.

Figure 8:
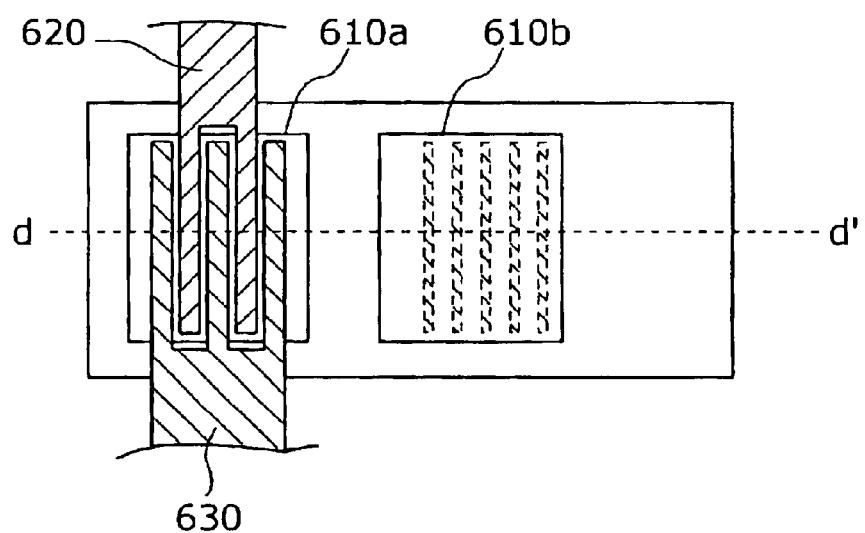
FIG. 8 is an enlarged plan view of the bipolar transistor according to the embodiment of the present invention (an enlarged view of the first group of transistors 610a and the second group of transistors 610b).
Figure 9:
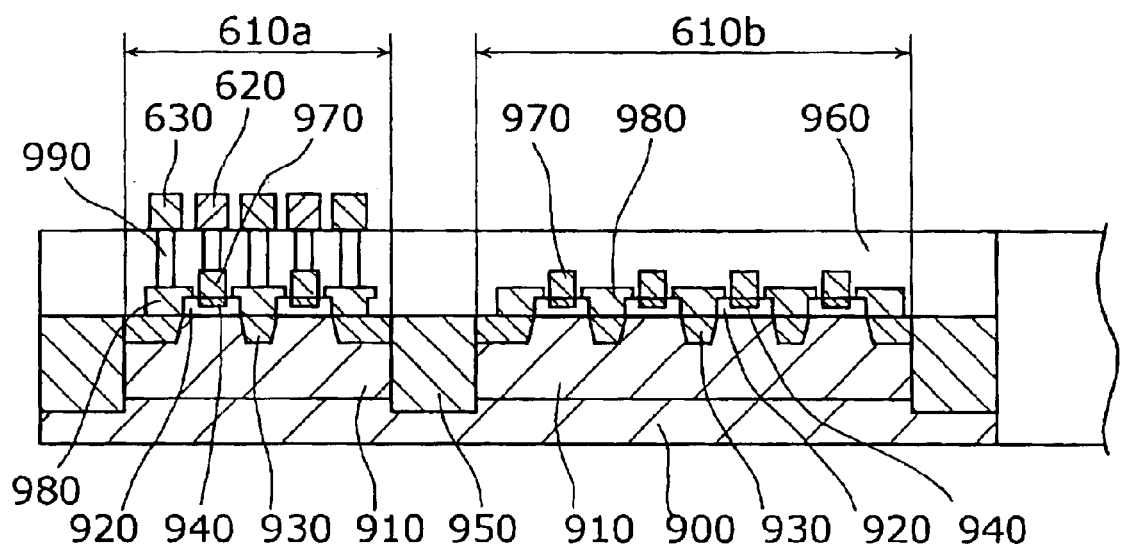
FIG. 9 is a cross-sectional view of the bipolar transistor according to the embodiment of the present invention (a cross-sectional view across the d–d' line in FIG. 8).

FIG. 8 is an enlarged plan view of the first group of transistors 610a and the second group of transistors 610b in FIG. 7. FIG. 9 is a cross-sectional view of the bipolar transistor (a cross-sectional view across the d–d' line in FIG. 8). Note that the same elements in FIG. 6 as in FIGS. 8–9 are given the same characters and their detailed explanations are omitted here.

As is shown in FIGS. 8–9, a plurality of unit transistors is formed in the first group of transistors 610a and the second group of transistors 610b. The plurality of unit transistors is composed of N type collectors 910 that are formed on an N+ type semiconductor substrate 900 and that are made from silicon epitaxial layers, P type bases 920 that are formed on the surface of the N type collectors 910 by an ion implantation technique, a silicon epitaxial method and the like, element separation regions 930 that are formed in the N type collectors 910 in order to insulate and separate each P type base 920, and N type emitters 940 that are formed on surfaces of the P type bases 920 by diffusing an impurity. In order to separate the first group of transistors 610a and the second group of transistors 610b completely like islands, an insulation separation region 950 that is formed by a trench separation method, a LOCOS (Local Oxidation of Silicon) method and the like, and the depth of which reaches the N+ type semiconductor substrate 900, is formed as a channel stopper between the first group of transistors 610a and the second group of transistors 610b. The plurality of unit transistors is covered by an insulation film 960. In addition, it is stated that the P type bases 920 are formed by an epitaxial method and the N type emitters 940 are formed by diffusing an impurity. But it is acceptable that the P type bases 920 and the N type emitters 940 are formed on the N type collectors 910 in sequence by epitaxial growth. Additionally, it is also acceptable that the P type bases 920 and the N type emitters 940 are formed on the surface of the N type collectors 910 in sequence by diffusing an impurity.

Moreover, N type polycrystalline silicon films 970 are formed on the N type emitters 940; P type polycrystalline silicon films 980, as outer base layers, are formed on the P type bases 920 and the element separation regions 930.

Here, through holes 990 that penetrate the insulation film 960 are formed in the insulation film 960. The emitter lead wires 620 and the base lead wires 630 are connected with the N type polycrystalline silicon films 970 and the P type polycrystalline silicon films 980 respectively via the through holes 990 in which wiring plugs are embedded.

Regarding the bipolar transistor with the structure described above, bipolar transistors of different transistor sizes are, as is shown in FIGS. 8 and 9, realized by selecting an arbitrary group or arbitrary groups of transistors among the first group of transistors 610a, the second group of transistors 610b, the third group of transistors 610c and the fourth group of transistors 610d and connecting the emitter lead wire 620 and the base lead wire 630 with the selected group(s) of transistors. Here, a manufacturing method for the bipolar transistor with the structure described above is realized within the range of ordinary micro fabrication technology and self-aligning technology.

As is described above, according to the present embodiment, the bipolar transistor includes the first group of transistors 610a, the second group of transistors 610b, the third group of transistors 610c and the fourth group of transistors 610d; the number of unit transistors is 2, 4, 8 and 16, respectively. Therefore, by changing combinations of the groups of transistors selected using the emitter lead wire 620 and the base lead wire 630, it is possible to realize the bipolar transistor having the even number of transistors, the number being any even number ranging from 2 to 30. Consequently, the bipolar transistor according to the present embodiment can realize the bipolar transistor that can meet the requirement of the market for flexible transistor sizes.

Furthermore, according to the present embodiment, it is not the emitter(s) and the base(s) but the group(s) of transistors that are selected. Therefore, in the selected group(s) of transistors, all the N type emitters 940 and all the P type bases 920 are used and the capacity among the collector(s) and the bases does not increase. Consequently, the bipolar transistor according to the present embodiment can realize the bipolar transistor that does not deteriorate the high frequency characteristics.

Additionally, according to the present embodiment, the number of unit transistors of each group of transistors is different from each other, the number being $2^n$ and 2 at the minimum and $2^m$ at the maximum. Therefore, when compared with the case of setting up a plurality of transistors with one emitter, the number of the insulation separation regions that exist among the groups of bipolar transistors decreases. Consequently, the bipolar transistor according to the present embodiment can realize the bipolar transistor that does not need a large semiconductor substrate.

Figure 10:
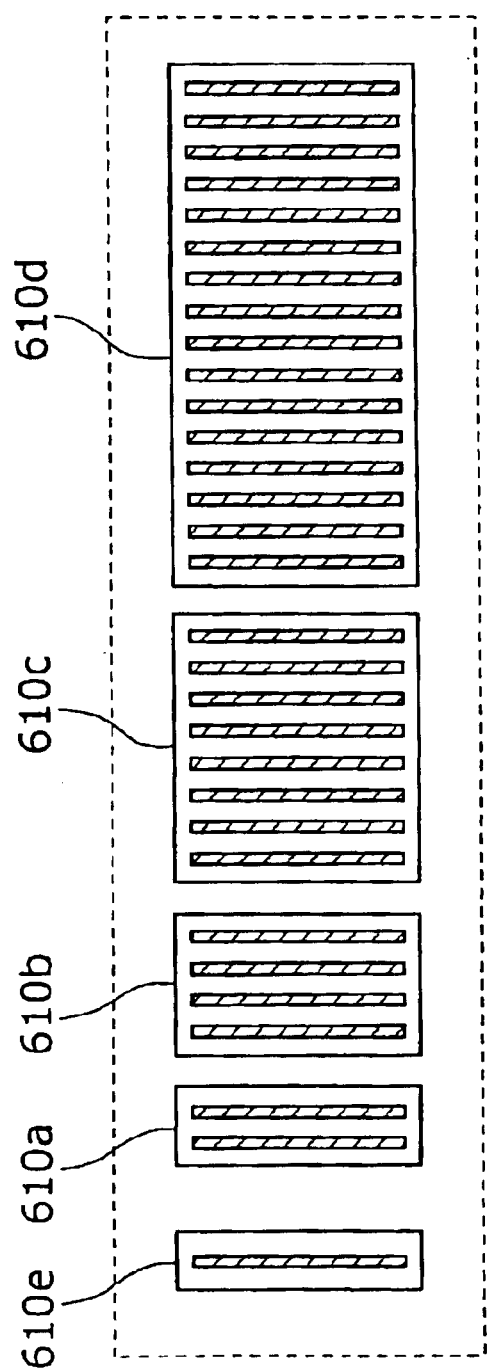
FIG. 10 is a plan view of a modified example of the bipolar transistor according to the embodiment of the present invention.

By the way, according to the present embodiment, it is stated that the bipolar transistor includes the group(s) of transistors that have $2^n$, 2 at the minimum and $2^m$ at the maximum, pieces of unit transistors. The number of unit transistors is not, however, limited to $2^n$ when dimensional precision in manufacturing the unit transistors is not considered. As is shown in FIG. 10, a plan view, it is acceptable that the bipolar transistor further includes another group of transistors 610e whose number of the unit transistors is 1 and an arbitrary group or groups are selected from a plurality of groups of transistors including the group of transistors 610e.

Moreover, the emitter lead wire 620 and the base lead wire 630 are formed by one-layer lead wires but two-layer lead wires are also acceptable.

As is apparent from the description above, since the bipolar transistor according to the present embodiment can realize the bipolar transistor having every even number of unit transistors, the number being 2 at the minimum and $2^m$ at the maximum, an effect of realizing the bipolar transistor that has successive number of unit transistors and that can meet requirement of the market for flexible transistor sizes is achieved. Furthermore, since the bipolar transistor according to the present embodiment uses all the N type emitters and P type bases in the selected group(s) of transistors, the capacity among the collector(s) and the bases does not increase. Therefore an effect of realizing the bipolar transistor that does not deteriorate the high-frequency characteristics is achieved. Additionally, the bipolar transistor according to the present embodiment has the fewer number of insulation separation regions that exist among each group of transistors when compared with the case of setting up a plurality of transistors with one emitter. Therefore, an effect of realizing the bipolar transistor that does not need a large semiconductor substrate is achieved.

Consequently, it is possible to provide the bipolar transistor that meets requirement of the market for flexible transistor sizes and its practical value is extremely high.

What is claimed is:

1. A multi-fingered bipolar transistor formed on one semiconductor substrate, the bipolar transistor comprising groups of unit transistors that can be connected in parallel, wherein the number of unit transistors is different from group to group and is defined as $2^n$ (n is a positive integer).

2. The bipolar transistor according to claim 1 further comprising:

wherein the group further includes insulation films formed to cover the unit transistors, the bipolar transistor further comprising:

bonding pads that are formed on the insulation films; and lead wires through the insulation films that connect the group with the bonding pads.

3. The bipolar transistor according to claim 1 further comprising:

a group of transistors having one unit transistor.

4. The bipolar transistor according to claim 1, wherein the number of the groups is m, the groups being the first group to the "m"th group, and the "i"th (i=1~m) group has $2^i$ pieces of the unit transistors.

5. The bipolar transistor according to claim 4, wherein the group further includes insulation films formed to cover the unit transistors, the bipolar transistor further comprising:

bonding pads formed on the insulation films; and lead wires through the insulation films that connect the group with the bonding pads.

6. The bipolar transistor according to claim 4 further comprising:

a group of transistors having one unit transistor.

7. The bipolar transistor according to claim 4, wherein the "m" is 4.

8. The bipolar transistor according to claim 7 further comprising:

a group of transistors having one unit transistor.

9. The bipolar transistor according to claim 7, wherein the group further includes insulation films formed to cover the unit transistors, the bipolar transistor further comprising:

bonding pads formed on the insulation films; and lead wires through the insulation films that connect the group with the bonding pads.

10. The bipolar transistor according to claim 9 further comprising:

a collector electrode formed on a side opposite to the side of the semiconductor substrate on which the group is formed, wherein the lead wires connect emitters and bases of the group with the bonding pads.

11. The bipolar transistor according to claim 9 further comprising:

a group of transistors having one unit transistor.

12. The bipolar transistor according to claim 9, wherein the lead wires are selectively connected to the groups.

13. The bipolar transistor according to claim 12 further comprising:

a group of transistors having one unit transistor.

14. The bipolar transistor according to claim 12 further comprising:

a collector electrode formed on a side opposite to the side of the semiconductor substrate on which the group is formed, wherein the lead wires connect emitters and bases of the group with the bonding pads.

15. The bipolar transistor according to claim 14 further comprising:

a group of transistors having one unit transistor.

* * * * *